(12) United States Patent
Khlat

(10) Patent No.: US 10,581,156 B2
(45) Date of Patent: Mar. 3, 2020

(54) COMPENSATION CIRCUIT TO MITIGATE ANTENNA-TO-ANTENNA COUPLING

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

(*) Notice: Subject to any disclaimer, the term of this patent is extended or adjusted under 35 U.S.C. 154(b) by 168 days.

(21) Appl. No.: 15/586,374

(22) Filed: May 4, 2017

(65) Prior Publication Data

US 2017/0324159 A1    Nov. 9, 2017

Related U.S. Application Data

(60) Provisional application No. 62/331,612, filed on May 4, 2016.

(51) Int. Cl.
| | |
|---|---|
| *H01Q 1/52* | (2006.01) |
| *H03H 9/46* | (2006.01) |
| *H03H 9/24* | (2006.01) |
| *H03H 9/00* | (2006.01) |
| *H03H 11/44* | (2006.01) |

(52) U.S. Cl.
CPC .......... *H01Q 1/525* (2013.01); *H03H 9/0009* (2013.01); *H03H 9/24* (2013.01); *H03H 9/46* (2013.01); *H03H 9/0095* (2013.01); *H03H 11/44* (2013.01)

(58) Field of Classification Search
CPC ...... H04B 1/0064; H03H 11/362; H03H 9/00; H03H 5/02
See application file for complete search history.

(56) References Cited

U.S. PATENT DOCUMENTS

| 3,731,230 A | 5/1973 | Cerny, Jr. |
| 3,875,533 A | 4/1975 | Irwin et al. |
| (Continued) | | |

FOREIGN PATENT DOCUMENTS

JP    2012257050 A    12/2012

OTHER PUBLICATIONS

Non-Final Office Action for U.S. Appl. No. 14/757,651, dated May 8, 2018, 8 pages.

(Continued)

*Primary Examiner* — Ricardo I Magallanes
(74) *Attorney, Agent, or Firm* — Withrow & Terranova, P.L.L.C.

(57) ABSTRACT

A compensation circuit reduces the negative effects of antenna-to-antenna coupling between proximately located antennas. The compensation circuit is coupled between first and second antenna ports. A first transmit/receive path extends from radio frequency (RF) circuitry to the first antenna port. A second transmit/receive path extends from the RF circuitry to the second antenna port. Antennas are coupled to each of the antenna ports. The compensation circuit includes negatively coupled first and second inductors, which are coupled in series between the first antenna port and the second antenna port. At least one shunt acoustic resonator is coupled between a fixed voltage node and a common node between the first and second inductors. In operation, the compensation circuit presents a negative capacitance between the first antenna port and the second antenna port over the first frequency range to reduce the effects of the antenna-antenna coupling.

20 Claims, 16 Drawing Sheets

(56) References Cited

U.S. PATENT DOCUMENTS

| | | | |
|---|---|---|---|
| 4,442,434 A * | 4/1984 | Baekgaard | H01Q 7/00 343/701 |
| 4,577,168 A | 3/1986 | Hartmann | |
| 5,291,159 A | 3/1994 | Vale | |
| 6,067,391 A | 5/2000 | Land | |
| 6,670,866 B2 | 12/2003 | Ellaet et al. | |
| 6,714,099 B2 | 3/2004 | Hikita et al. | |
| 6,720,844 B1 | 4/2004 | Lakin | |
| 6,927,649 B2 | 8/2005 | Metzger et al. | |
| 7,057,478 B2 | 6/2006 | Korden et al. | |
| 7,173,504 B2 | 2/2007 | Larson, III et al. | |
| 7,239,067 B2 | 7/2007 | Komuro et al. | |
| 7,321,183 B2 | 1/2008 | Ebuchi et al. | |
| 7,342,351 B2 | 3/2008 | Kubo et al. | |
| 7,391,285 B2 | 6/2008 | Larson, III et al. | |
| 7,436,269 B2 | 10/2008 | Wang et al. | |
| 7,804,374 B1 | 9/2010 | Brown et al. | |
| 7,825,749 B2 | 11/2010 | Thalhammer et al. | |
| 7,855,618 B2 | 12/2010 | Frank et al. | |
| 7,898,493 B1 * | 3/2011 | Rojas | H01Q 5/00 343/850 |
| 7,956,705 B2 | 6/2011 | Meister et al. | |
| 7,973,620 B2 | 7/2011 | Shirakawa et al. | |
| 8,248,185 B2 | 8/2012 | Choy et al. | |
| 8,508,315 B2 | 8/2013 | Jamneala et al. | |
| 8,576,024 B2 | 11/2013 | Erb et al. | |
| 8,923,794 B2 | 12/2014 | Aigner | |
| 8,981,627 B2 | 3/2015 | Sakuma et al. | |
| 8,991,022 B2 | 3/2015 | Satoh et al. | |
| 9,054,671 B2 | 6/2015 | Adkisson et al. | |
| 9,054,674 B2 | 6/2015 | Inoue et al. | |
| 9,197,189 B2 | 11/2015 | Miyake | |
| 9,484,883 B2 | 11/2016 | Nishizawa et al. | |
| 9,698,756 B2 | 7/2017 | Khlat et al. | |
| 9,887,686 B2 | 2/2018 | Kuwahara | |
| 9,929,716 B2 | 3/2018 | Lee et al. | |
| 10,009,001 B2 | 6/2018 | Jiang et al. | |
| 2002/0109564 A1 | 8/2002 | Tsai et al. | |
| 2005/0093648 A1 | 5/2005 | Inoue | |
| 2005/0206476 A1 | 9/2005 | Ella et al. | |
| 2006/0091978 A1 | 5/2006 | Wang et al. | |
| 2008/0007369 A1 | 1/2008 | Barber et al. | |
| 2008/0297278 A1 | 12/2008 | Handtmann et al. | |
| 2009/0096549 A1 | 4/2009 | Thalhammer et al. | |
| 2009/0096550 A1 | 4/2009 | Handtmann et al. | |
| 2010/0277237 A1 | 11/2010 | Sinha et al. | |
| 2011/0115334 A1 | 5/2011 | Konishi et al. | |
| 2011/0210787 A1 | 9/2011 | Lee et al. | |
| 2012/0007696 A1 | 1/2012 | Pang et al. | |
| 2012/0187799 A1 | 7/2012 | Nakahashi | |
| 2012/0313725 A1 | 12/2012 | Ueda et al. | |
| 2013/0033150 A1 | 2/2013 | Bardong et al. | |
| 2013/0113576 A1 | 5/2013 | Inoue et al. | |
| 2014/0145557 A1 | 5/2014 | Tanaka | |
| 2014/0167565 A1 | 6/2014 | Iwamoto | |
| 2015/0222246 A1 | 8/2015 | Nosaka | |
| 2015/0369153 A1 | 12/2015 | Tsunooka et al. | |
| 2016/0028364 A1 | 1/2016 | Takeuchi | |
| 2016/0056789 A1 | 2/2016 | Otsubo et al. | |
| 2016/0191012 A1 | 6/2016 | Khlat et al. | |
| 2016/0191014 A1 | 6/2016 | Khlat et al. | |
| 2016/0191016 A1 | 6/2016 | Khlat et al. | |
| 2016/0261235 A1 | 9/2016 | Ortiz | |
| 2016/0268998 A1 * | 9/2016 | Xu | H03H 9/0004 |
| 2016/0308576 A1 * | 10/2016 | Khlat | H04B 1/18 |
| 2016/0359468 A1 | 12/2016 | Taniguchi et al. | |
| 2017/0093369 A1 | 3/2017 | Khlat et al. | |
| 2017/0093370 A1 | 3/2017 | Khlat et al. | |
| 2017/0141757 A1 * | 5/2017 | Schmidhammer | H03H 9/542 |
| 2017/0201233 A1 | 7/2017 | Khlat | |
| 2017/0301992 A1 | 10/2017 | Khlat et al. | |
| 2017/0338795 A1 | 11/2017 | Nakagawa et al. | |
| 2018/0013402 A1 | 1/2018 | Kirkpatrick et al. | |
| 2018/0041191 A1 | 2/2018 | Park | |
| 2018/0076793 A1 | 3/2018 | Khlat et al. | |
| 2018/0076794 A1 | 3/2018 | Khlat et al. | |
| 2018/0109236 A1 | 4/2018 | Konoma | |
| 2018/0109237 A1 | 4/2018 | Wasilik et al. | |
| 2018/0145658 A1 | 5/2018 | Saji | |
| 2018/0219530 A1 | 8/2018 | Khlat et al. | |
| 2018/0241418 A1 | 8/2018 | Takamine et al. | |
| 2019/0140618 A1 | 5/2019 | Takamine | |
| 2019/0199320 A1 | 6/2019 | Morita et al. | |
| 2019/0207583 A1 | 7/2019 | Miura et al. | |
| 2019/0288664 A1 | 9/2019 | Saji | |

OTHER PUBLICATIONS

Notice of Allowance for U.S. Appl. No. 15/347,428, dated Jul. 12, 2018, 9 pages.
Notice of Allowance for U.S. Appl. No. 15/490,381, dated May 23, 2018, 8 pages.
Lakin, K. M., "Coupled Resonator Filters," 2002 IEEE Ultrasonics Symposium, Oct. 8-11, 2002, Munich, Germany, 8 pages.
López, Edén Corrales, "Analysis and Design of Bulk Acoustic Wave Filters Based on Acoustically Coupled Resonators," PhD Thesis, Department of Telecommunications and Systems Engineering, Autonomous University of Barcelona, May 2011, 202 pages.
Shirakawa, A. A., et al., "Bulk Acoustic Wave-Coupled Resonator Filters: Concept, Design, and Application," International Journal of RF and Microwave Computer-Aided Engineering, vol. 21, No. 5, Sep. 2011, 9 pages.
Final Office Action for U.S. Appl. No. 15/275,957, dated Jan. 2, 2018, 7 pages.
Non-Final Office Action for U.S. Appl. No. 14/757,587, dated Sep. 13, 2016, 12 pages.
Notice of Allowance for U.S. Appl. No. 14/757,587, dated Mar. 9, 2017, 8 pages.
Non-Final Office Action for U.S. Appl. No. 15/004,084, dated Jun. 12, 2017, 9 pages.
Non-Final Office Action for U.S. Appl. No. 14/757,651, dated Jun. 9, 2017, 11 pages.
Non-Final Office Action for U.S. Appl. No. 15/275,957, dated Jun. 14, 2017, 9 pages.
Ex Parte Quayle Action for U.S. Appl. No. 15/347,452, dated Jun. 15, 2017, 7 pages.
Final Office Action for U.S. Appl. No. 14/757,651, dated Sep. 19, 2018, 7 pages.
Non-Final Office Action for U.S. Appl. No. 15/701,759, dated Oct. 4, 2018, 10 pages.
Author Unknown, "SAW Filters—SAW Resonators: Surface Acoustic Wave SAW Components," Product Specification, 2010, Token Electronics Industry Co., Ltd., 37 pages.
Fattinger, Gernot et al., "Miniaturization of BAW Devices and the Impact of Wafer Level Packaging Technology," Joint UFFC, EFTF and PFM Symposium, Jul. 21-25, 2013, Prague, Czech Republic, IEEE, pp. 228-231.
Kwa, Tom, "Wafer-Level Packaged Accelerometer With Solderable SMT Terminals," IEEE Sensors, Oct. 22-25, 2006, Daegu, South Korea, IEEE, pp. 1361-1364.
Potter, Bob R. et al., "Embedded Inductors Incorporated in the Design of SAW Module SMT Packaging," Proceedings of the 2002 Ultrasonics Symposium, Oct. 8-11, 2002, IEEE, pp. 397-400.
Schneider, Robert, "High-Q AlN Contour Mode Resonators with Unattached, Voltage-Actuated Electrodes," Thesis, Technical Report No. UCB/EECS-2015-247, Dec. 17, 2015, Electrical Engineering and Computer Sciences, University of California at Berkeley, http://www.eecs.berkeley.edu/Pubs/TechRpts/2015/EECS-2015-247. html, Robert Anthony Schneider, 222 pages.
Corrales, Eden, et al., "Design of Three-Pole Bulk Acoustic Wave Coupled Resonator Filters," 38th European Microwave Conference, Oct. 2008, Amsterdam, Netherlands, EuMA, pp. 357-360.
De Paco, Pedro, et al., "Equivalent Circuit Modeling of Coupled Resonator Filters," Transactions on Ultrasonics, Ferroelectrics, and Frequency Control, vol. 55, Issue 9, Sep. 2008, IEEE, pp. 2030-2037.
Lakin, K. M., "Bulk Acoustic Wave Coupled Resonator Filters," International Frequency Control Symposium, 2002, IEEE, pp. 8-14.

(56) References Cited

OTHER PUBLICATIONS

Shirakawa, A. A., et al., "Bulk Acoustic Wave Coupled Resonator Filters Synthesis Methodology," European Microwave Conference, Oct. 4-6, 2005, Paris, France, IEEE, 4 pages.
Tosic, Dejan, et al., "Symbolic analysis of immitance inverters," 14th Telecommunications Forum, Nov. 21-23, 2006, Belgrade, Serbia, pp. 584-487.
Notice of Allowance for U.S. Appl. No. 15/727,117, dated Mar. 13, 2019, 9 pages.
Notice of Allowance for U.S. Appl. No. 15/720,706, dated Mar. 15, 2019, 9 pages.
Non-Final Office Action for U.S. Appl. No. 15/697,658, dated May 1, 2019, 13 pages.
Final Office Action for U.S. Appl. No. 15/697,658, dated Oct. 22, 2019, 9 pages.
Notice of Allowance for U.S. Appl. No. 15/644,922, dated Oct. 21, 2019, 10 pages.
Non-Final Office Action for U.S. Appl. No. 15/883,933, dated Oct. 25, 2019, 19 pages.

\* cited by examiner

T-MODEL OF COMPENSATION CIRCUIT

π MODEL OF COMPENSATION CIRCUIT

COMPENSATION CIRCUIT TO MITIGATE ANTENNA-TO-ANTENNA COUPLING

RELATED APPLICATIONS

This application claims the benefit of U.S. provisional patent application Ser. No. 62/331,612, filed May 4, 2016, the disclosure of which is hereby incorporated herein by reference in its entirety.

FIELD OF THE INVENTION

The present disclosure relates to a compensation circuit to mitigate antenna-to-antenna coupling.

BACKGROUND

Today's mobile terminals must communicate using different communication technologies in different bands, which vary significantly in both bandwidth and frequency. To further complicate matters, data rates are ever increasing and there is a need to transmit and receive over these different bands at the same time. As a result, mobile terminals have very complicated front-end configurations and are starting to employ multiple antennas for transmitting and receiving information. Since mobile terminals are relatively small, the multiple antennas are relatively close to one another. As a result, the antennas may interact with one another and modify each other's radiation patterns, which generally alters the antenna's radiation efficiency and effectiveness. A particularly problematic issue is associated with antenna-to-antenna coupling, wherein an effective impedance is presented between antennas that are in close proximity to one another. Accordingly, there is a need for a technique to reduce or eliminate the impact of antenna-to-antenna coupling.

SUMMARY

The present disclosure relates to a compensation circuit that reduces the negative effects of antenna-to-antenna coupling between proximately located antennas. The compensation circuit is coupled between first and second antenna ports. A first transmit/receive path extends from radio frequency (RF) circuitry to the first antenna port. A second transmit/receive path extends from the RF circuitry to the second antenna port. Antennas are coupled to each of the antenna ports. The compensation circuit includes negatively coupled first and second inductors, which are coupled in series between the first antenna port and the second antenna port. At least one shunt acoustic resonator is coupled between a fixed voltage node and a common node between the first and second inductors. In operation, the compensation circuit presents a negative capacitance between the first antenna port and the second antenna port over the first frequency range to reduce the effects of the antenna-antenna coupling.

In certain embodiments, the at least two shunt acoustic resonators are coupled between the common node and the fixed voltage node. The first shunt acoustic resonator may have a first series resonance frequency, and the second shunt acoustic resonator may have a second series resonance frequency, which is different from the first series resonance frequency. Further, the first inductor and the second inductor have different inductances. In such embodiments, the compensation circuit may present a second negative capacitance, which may be the same as or different from the first negative capacitance, over a second range that is different than the first range.

Further, a first capacitor may be coupled between the first antenna port and the first inductor, and a second capacitor may be coupled between the second antenna port and the second inductor. As such, the first capacitor, the first inductor, the second inductor, and the second capacitor are coupled in series between the first antenna port and the second antenna port. A variable capacitance may also be coupled between the common node and the fixed voltage node, such that the variable capacitance is in parallel with the first and second shunt acoustic resonators.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
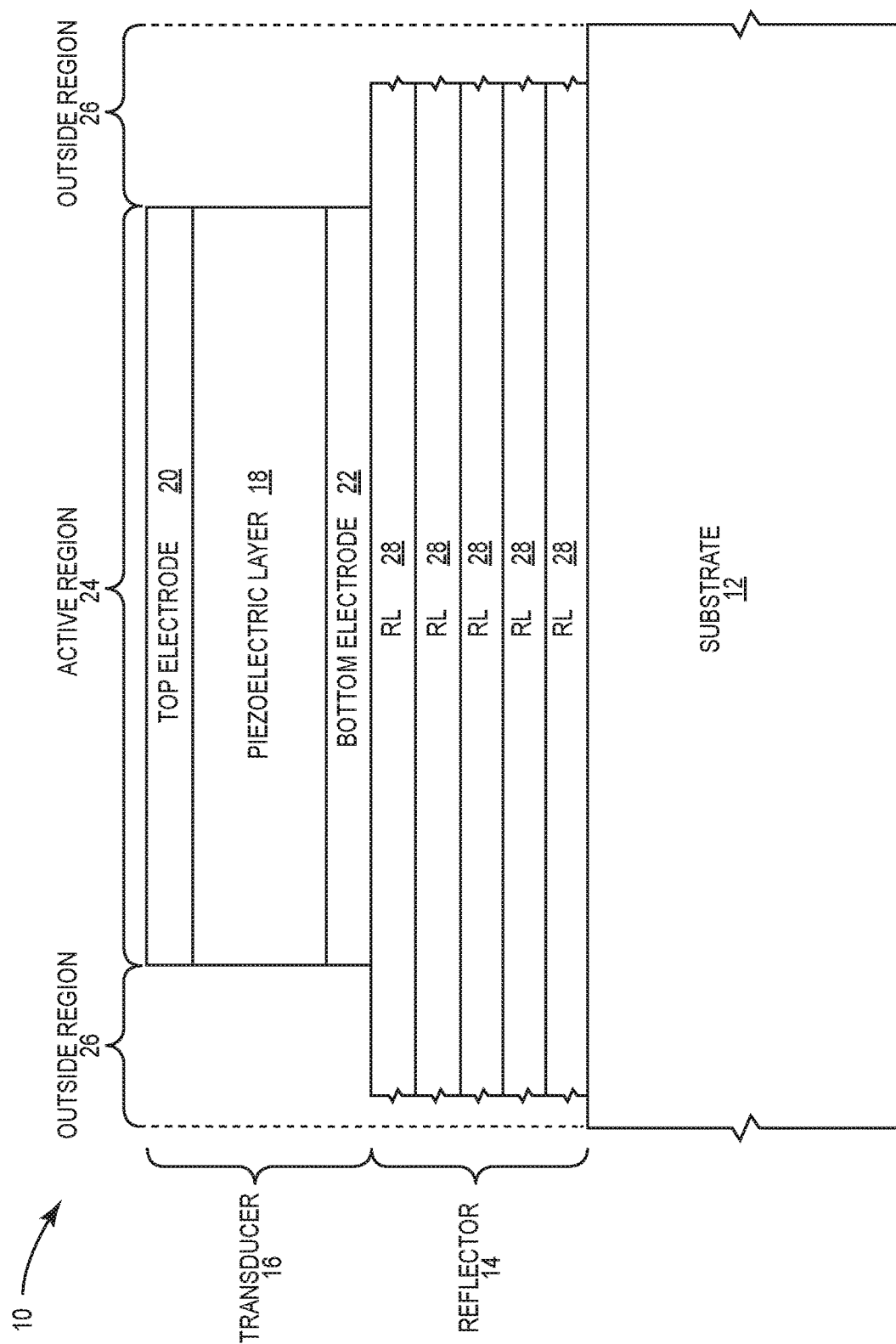
FIG. 1 illustrates a conventional Bulk Acoustic Wave (BAW) resonator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the figures. It will be understood that these terms and those discussed previously are intended to encompass different orientations of the device in addition to the orientation depicted in the figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a compensation circuit that reduces the negative effects of antenna-to-antenna coupling between proximately located antennas. The compensation circuit is coupled between first and second antenna ports. A first transmit/receive path extends from radio frequency (RF) circuitry to the first antenna port. A second transmit/receive path extends from the RF circuitry to the second antenna port. Antennas are coupled to each of the antenna ports. The compensation circuit includes negatively coupled first and second inductors, which are coupled in series between the first antenna port and the second antenna port. At least one shunt acoustic resonator is coupled between a fixed voltage node and a common node between the first and second inductors. In operation, the compensation circuit presents a negative capacitance between the first antenna port and the second antenna port over the first frequency range to reduce the effects of the antenna-antenna coupling.

In certain embodiments, the at least two shunt acoustic resonators are coupled between the common node and the fixed voltage node. The first shunt acoustic resonator may have a first series resonance frequency, and the second shunt acoustic resonator may have a second series resonance frequency, which is different from the first series resonance frequency. Further, the first inductor and the second inductor have different inductances. In such embodiments, the compensation circuit may present a second negative capacitance, which may be the same as or different from the first negative capacitance, over a second range that is different than the first range.

Further, a first capacitor may be coupled between the first antenna port and the first inductor, and a second capacitor may be coupled between the second antenna port and the second inductor. As such, the first capacitor, the first inductor, the second inductor, and the second capacitor are coupled in series between the first antenna port and the second antenna port. A variable capacitance may also be coupled between the common node and the fixed voltage node, such that the variable capacitance is in parallel with the first and second shunt acoustic resonators.

Prior to delving in to the details of the compensation circuits disclosed herein for reducing antenna-to-antenna coupling, an overview of certain types of acoustic resonators is provided. Acoustic resonators are employed in these compensation circuits. Acoustic resonators, such as Surface Acoustic Wave (SAW) resonators and Bulk Acoustic Wave (BAW) resonators, are used in many high-frequency communication applications. In particular, SAW resonators are often employed in filter networks that operate at frequencies up to 1.8 GHz, and BAW resonators are often employed in filter networks that operate at frequencies above 1.5 GHz. Such filters need to have flat passbands, have steep filter skirts and squared shoulders at the upper and lower ends of the passband, and provide excellent rejection outside of the passband. SAW- and BAW-based filters also have relatively low insertion loss, tend to decrease in size as the frequency of operation increases, and are relatively stable over wide temperature ranges. As such, SAW- and BAW-based filters are the filter of choice for many 3rd Generation (3G) and 4th Generation (4G) wireless devices and are destined to dominate filter applications for 5th Generation (5G) wireless devices. Most of these wireless devices support cellular, wireless fidelity (Wi-Fi), Bluetooth, and/or near field communications on the same wireless device and, as such, pose extremely challenging filtering demands. While these demands keep raising the complexity of wireless devices, there is a constant need to improve the performance of acoustic resonators and filters that are based thereon.

To better understand acoustic resonators and various terminology associated therewith, the following provides an overview of a BAW resonator. However, the concepts described herein may employ any type of acoustic resonator and are not limited to SAW- and BAW-based resonators. An exemplary BAW resonator 10 is illustrated in FIG. 1. The BAW resonator 10 generally includes a substrate 12, a reflector 14 mounted over the substrate 12, and a transducer 16 mounted over the reflector 14. The transducer 16 rests on the reflector 14 and includes a piezoelectric layer 18, which is sandwiched between a top electrode 20 and a bottom electrode 22. The top and bottom electrodes 20 and 22 may be formed of Tungsten (W), Molybdenum (Mo), Platinum (Pt), or like material, and the piezoelectric layer 18 may be formed of Aluminum Nitride (AlN), Zinc Oxide (ZnO), or other appropriate piezoelectric material. Although shown in FIG. 1 as each including a single layer, the piezoelectric layer 18, the top electrode 20, and/or the bottom electrode 22 may include multiple layers of the same material, multiple layers in which at least two layers are different materials, or multiple layers in which each layer is a different material.

The BAW resonator 10 is divided into an active region 24 and an outside region 26. The active region 24 generally corresponds to the section of the BAW resonator 10 where the top and bottom electrodes 20 and 22 overlap and also includes the layers below the overlapping top and bottom electrodes 20 and 22. The outside region 26 corresponds to the section of the BAW resonator 10 that surrounds the active region 24.

For the BAW resonator 10, applying electrical signals across the top electrode 20 and the bottom electrode 22 excites acoustic waves in the piezoelectric layer 18. These acoustic waves primarily propagate vertically. A primary goal in BAW resonator design is to confine these vertically propagating acoustic waves in the transducer 16. Acoustic waves traveling upward are reflected back into the transducer 16 by the air-metal boundary at the top surface of the top electrode 20. Acoustic waves traveling downward are reflected back into the transducer 16 by the reflector 14 or by an air cavity, which is provided just below the transducer in a Film BAW Resonator (FBAR).

The reflector 14 is typically formed by a stack of reflector layers (RL) 28, which alternate in material composition to produce a significant reflection coefficient at the junction of adjacent reflector layers 28. Typically, the reflector layers 28 alternate between materials having high and low acoustic impedances, such as tungsten (W) and silicon dioxide ($SiO_2$). While only five reflector layers 28 are illustrated in FIG. 1, the number of reflector layers 28 and the structure of the reflector 14 varies from one design to another.

Figure 2:
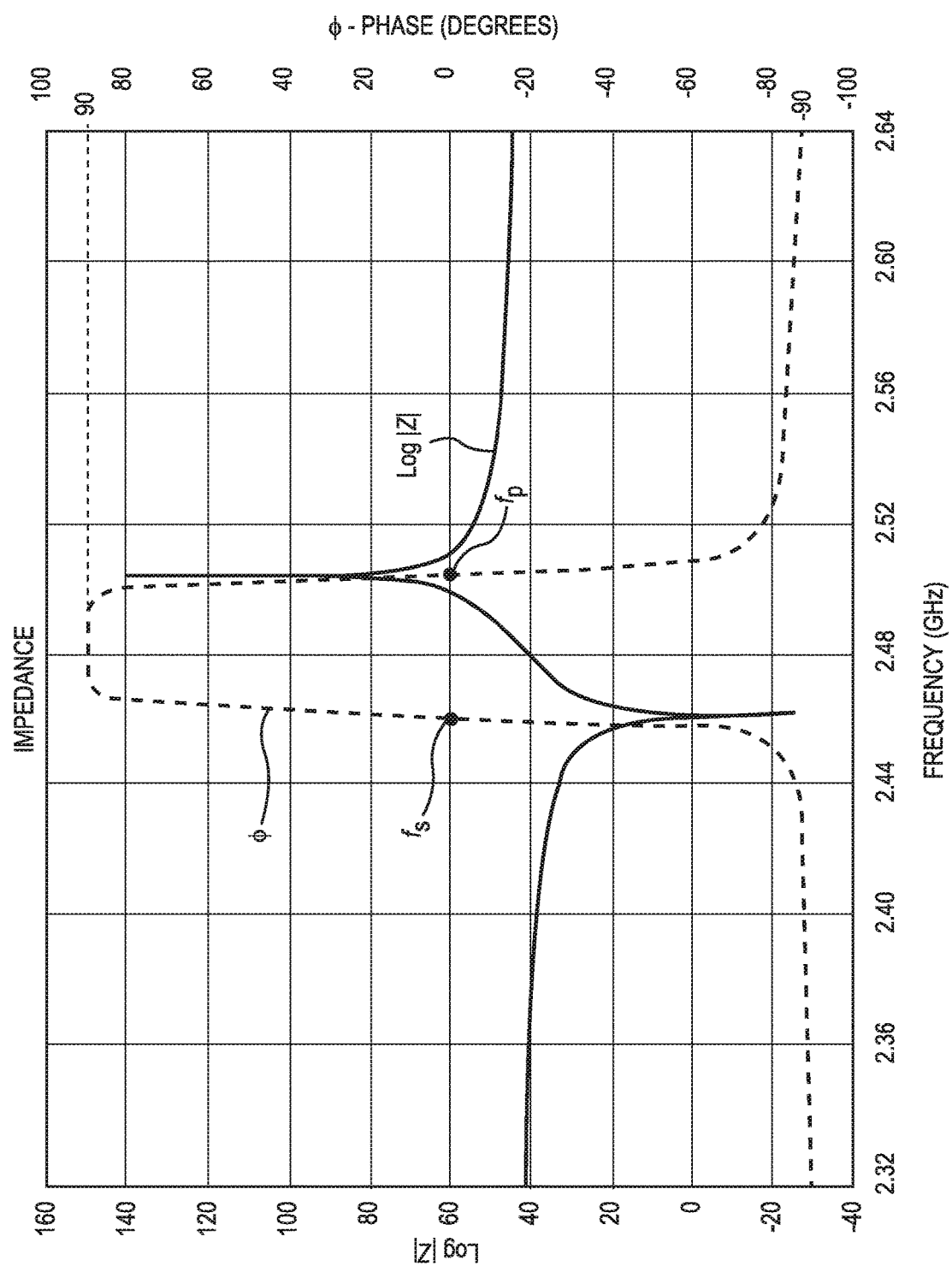
FIG. 2 is a graph of the magnitude and phase of impedance over frequency responses as a function of frequency for an ideal BAW resonator.

The magnitude (Z) and phase ($\phi$) of the electrical impedance as a function of the frequency for a relatively ideal BAW resonator 10 is provided in FIG. 2. The magnitude (Z) of the electrical impedance is illustrated by the solid line, whereas the phase ($\phi$) of the electrical impedance is illustrated by the dashed line. A unique feature of the BAW resonator 10 is that it has both a resonance frequency and an anti-resonance frequency. The resonance frequency is typically referred to as the series resonance frequency ($f_s$), and the anti-resonance frequency is typically referred to as the parallel resonance frequency ($f_p$). The series resonance frequency ($f_s$) occurs when the magnitude of the impedance, or reactance, of the BAW resonator 10 approaches zero. The parallel resonance frequency ($f_p$) occurs when the magnitude of the impedance, or reactance, of the BAW resonator 10 peaks at a significantly high level. In general, the series resonance frequency ($f_s$) is a function of the thickness of the piezoelectric layer 18 and the mass of the bottom and top electrodes 20 and 22.

For the phase, the BAW resonator 10 acts like an inductance that provides a 90° phase shift between the series resonance frequency ($f_s$) and the parallel resonance frequency ($f_p$). In contrast, the BAW resonator 10 acts like a capacitance that provides a −90° phase shift below the series resonance frequency ($f_s$) and above the parallel resonance frequency ($f_p$). The BAW resonator 10 presents a very low, near zero, resistance at the series resonance frequency ($f_s$) and a very high resistance at the parallel resonance frequency ($f_p$). The electrical nature of the BAW resonator 10 lends itself to the realization of a very high Q (quality factor) inductance over a relatively short range of frequencies, which has proved to be very beneficial in high-frequency filter networks, especially those operating at frequencies around 1.8 GHz and above.

Figure 3:
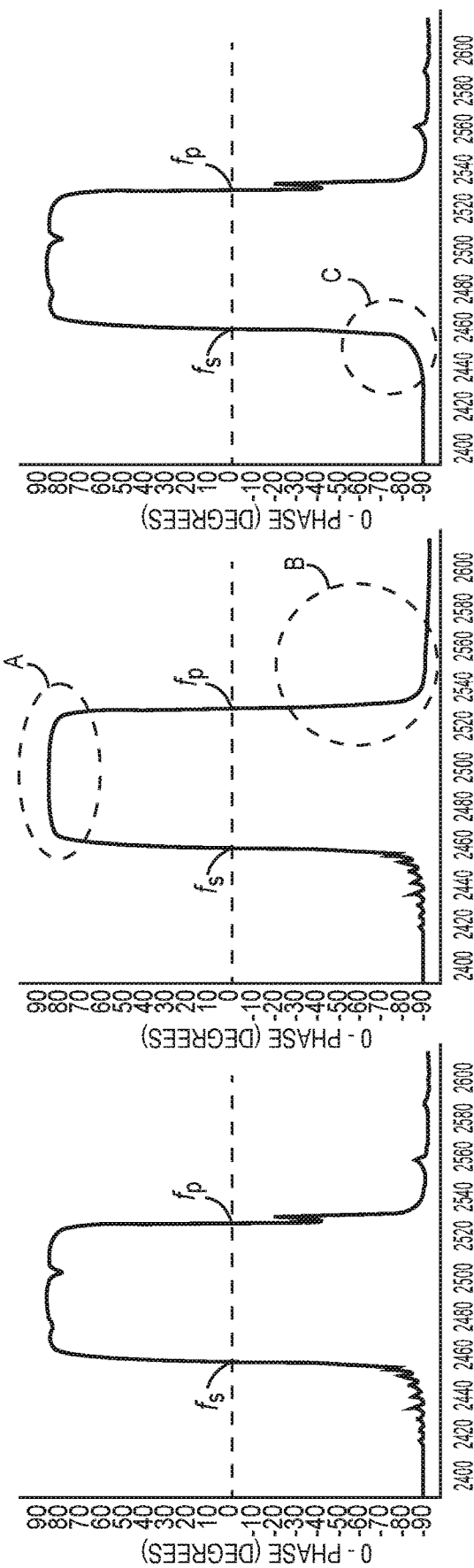
FIGS. 3A-3C are graphs of phase responses for various BAW resonator configurations.

Unfortunately, the phase ($\phi$) curve of FIG. 2 is representative of an ideal phase curve. In reality, approaching this ideal is challenging. A typical phase curve for the BAW resonator 10 of FIG. 1 is illustrated in FIG. 3A. Instead of being a smooth curve, the phase curve of FIG. 3A includes ripple below the series resonance frequency ($f_s$), between the series resonance frequency ($f_s$) and the parallel resonance frequency ($f_p$), and above the parallel resonance frequency ($f_p$). The ripple is the result of spurious modes, which are caused by spurious resonances that occur in corresponding frequencies. While the vast majority of the acoustic waves in the BAW resonator 10 propagate vertically, various boundary conditions about the transducer 16 result in the propagation of lateral (horizontal) acoustic waves, which are referred to as lateral standing waves. The presence of these lateral standing waves reduces the potential Q associated with the BAW resonator 10.

Figure 4:
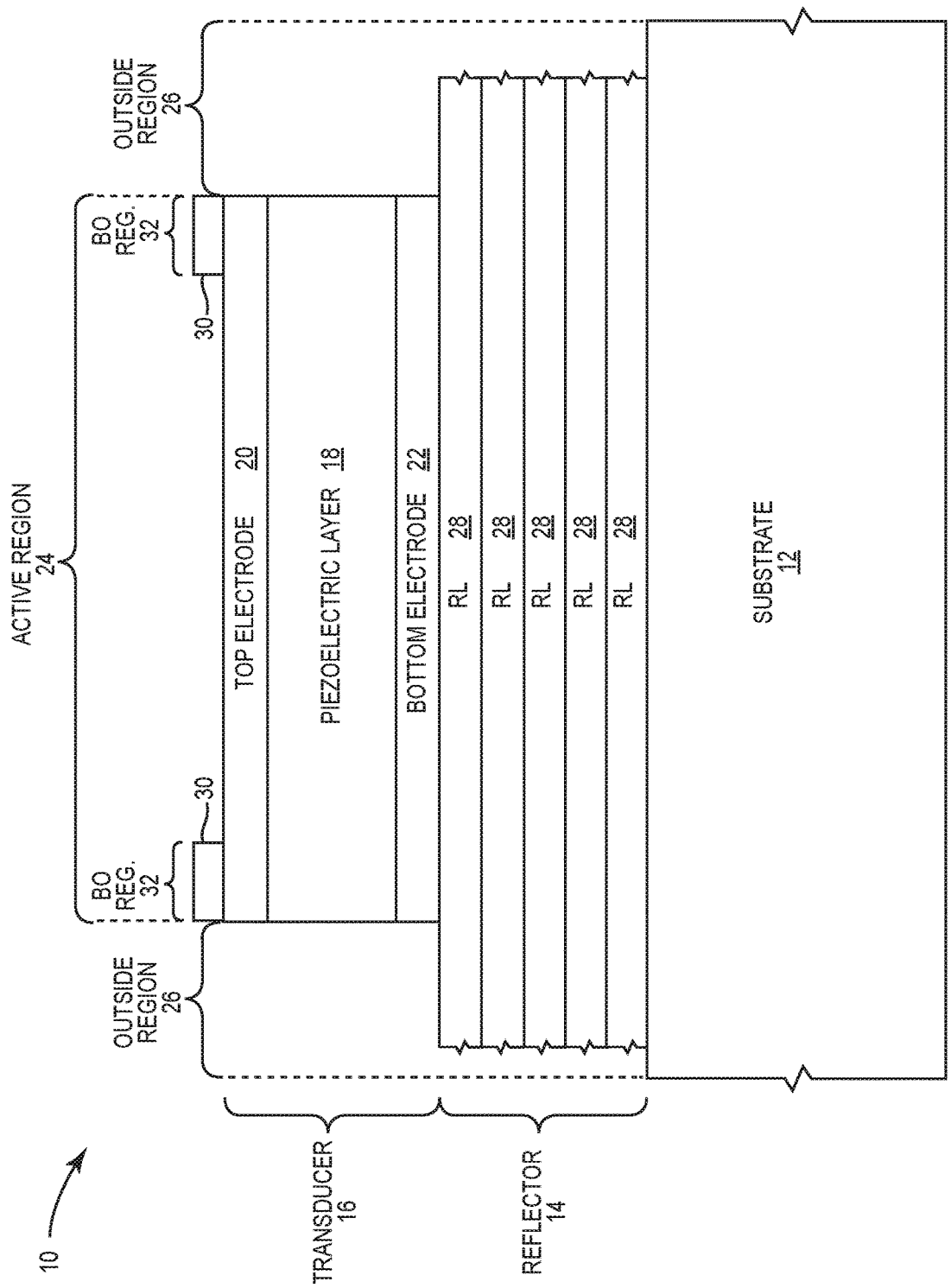
FIG. 4 illustrates a conventional BAW resonator with a border ring.

As illustrated in FIG. 4, a border (BO) ring 30 is formed on or within the top electrode 20 to suppress certain of the spurious modes. The spurious modes that are suppressed by the BO ring 30 are those above the series resonance frequency ($f_s$), as highlighted by circles A and B in the phase curve of FIG. 3B. Circle A shows a suppression of the ripple, and thus of the spurious mode, in the passband of the phase curve, which resides between the series resonance frequency ($f_s$) and the parallel resonance frequency ($f_p$). Circle B shows suppression of the ripple, and thus of the spurious modes, above the parallel resonance frequency ($f_p$). Notably, the spurious mode in the upper shoulder of the passband, which is just below the parallel resonance frequency $f_p$, and the spurious modes above the passband are suppressed, as evidenced by the smooth or substantially ripple free phase curve between the series resonance frequency ($f_s$) and the parallel resonance frequency ($f_p$) and above the parallel resonance frequency ($f_p$).

The BO ring 30 corresponds to a mass loading of the portion of the top electrode 20 that extends about the periphery of the active region 24. The BO ring 30 may correspond to a thickened portion of the top electrode 20 or the application of additional layers of an appropriate material over the top electrode 20. The portion of the BAW resonator 10 that includes and resides below the BO ring 30 is referred to as a BO region 32. Accordingly, the BO region 32 corresponds to an outer, perimeter portion of the active region 24 and resides inside of the active region 24.

While the BO ring 30 is effective at suppressing spurious modes above the series resonance frequency ($f_s$), the BO ring 30 has little or no impact on those spurious modes below the series resonance frequency ($f_s$), as shown by the ripples in the phase curve below the series resonance frequency ($f_s$) in FIG. 3B. A technique referred to as apodization is often used to suppress the spurious modes that fall below the series resonance frequency ($f_s$).

Apodization tries to avoid, or at least significantly reduce, any lateral symmetry in the BAW resonator 10, or at least in the transducer 16 thereof. The lateral symmetry corresponds to the footprint of the transducer 16, and avoiding the lateral symmetry corresponds to avoiding symmetry associated with the sides of the footprint. For example, one may choose a footprint that corresponds to a pentagon instead of a square or rectangle. Avoiding symmetry helps reduce the presence of lateral standing waves in the transducer 16. Circle C of FIG. 3C illustrates the effect of apodization in which the spurious modes below the series resonance frequency ($f_s$) are suppressed, as evidence by the smooth or substantially ripple free phase curve below the series resonance frequency ($f_s$). Assuming no BO ring 30 is provided, one can readily see in FIG. 3C that apodization fails to suppress those spurious modes above the series resonance frequency ($f_s$). As such, the typical BAW resonator 10 employs both apodization and the BO ring 30.

Figure 5:
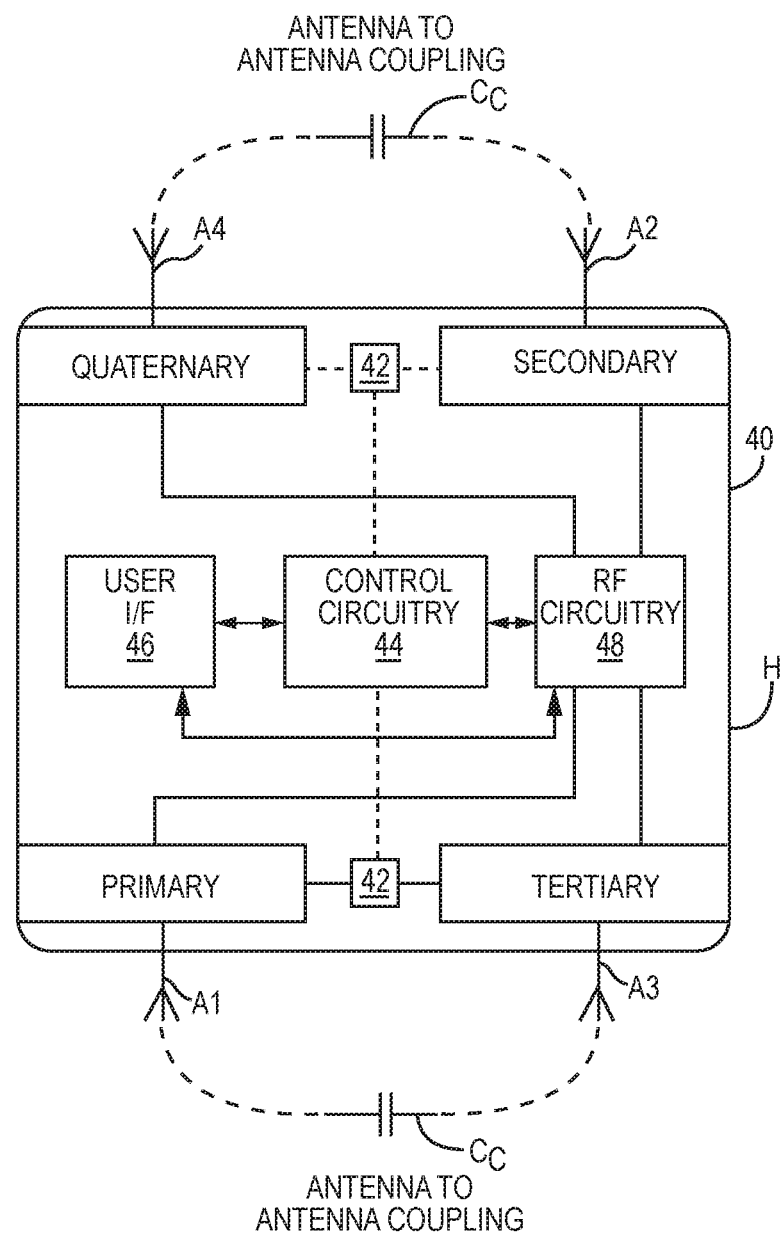
FIG. 5 is a block diagram of a mobile terminal according to one embodiment.

Today's mobile terminals must communicate using different communication technologies in different bands, which vary significantly in both bandwidth and frequency. To further complicate matters, data rates are ever increasing and the there is a need to transmit and receive over these different bands at the same time. As a result, mobile terminals have very complicated front-end configurations and are starting to employ multiple input multiple output (MIMO) transmission and reception technology, which requires the use of multiple antennas. FIG. 5 is a block diagram of a mobile terminal 40 that incorporates four antennas: a primary antenna A1, a secondary antenna A2, a tertiary antennae A3, and a quaternary antenna A4. While four antennas are illustrated, virtually any number of antennas may be used. The mobile terminal 40 generally includes control circuitry 44, which is associated with a user interface (I/F) 46, and radio frequency (RF) circuitry 48. The user interface 46 may include microphones, speakers, keypads, touchscreens, displays, and the like. The RF circuitry 48 may include baseband, transceiver, power amplifier, and switching circuitry, as will be appreciated by those skilled in the art.

In general, signals to be transmitted are provided by the RF circuitry 48 to one or more of the antennas A1-A4, and signals received by one or more of the antennas A1-A4 are routed to the RF circuitry 48 for demodulation and associated processing. The RF circuitry 48 may be configured to facilitate any number of communications, including first, second, third, fourth, and fifth generation cellular communications, wireless local area network (WLAN) communications, Bluetooth communications, industrial, scientific and medical (ISM) communications, near field communications, and the like. Any of these communications may use MIMO for transmission, reception, or both, depending on the capabilities of the mobile terminal 40 and the systems with which the mobile terminal 40 communicates.

Since mobile terminals 40 are relatively small, the multiple antennas A1-A4 used for MIMO are relatively close to one another. As a result, the antennas A1-A4 may interact with one another and modify each other's radiation patterns, which generally alters the antenna's radiation efficiency. A particularly problematic issue is associated with antenna-to-antenna coupling wherein an effective impedance is presented between antennas that are in close proximity to one another. The impedance is represented as a coupling capacitance $C_C$ presented between the primary antenna A1 and the tertiary antenna A3; however, the impedance will likely include a more complex combination of inductance and capacitance. As a result of this impedance (capacitance $C_C$), the effectiveness of the primary antenna A1, which may be used for transmission, and the tertiary antennae A3, which may be used for reception at the same time, may be significantly degraded given the coupling between antenna A1 and antenna A3. As such, there is a need for a cost effective and space efficient technique to resolve, or at least significantly reduce, the coupling between proximate antennas.

For the present disclosure, a compensation circuit 42 is coupled between pairs of antennas that are proximate one another. As illustrated in FIG. 5, a first compensation circuit 42 is coupled between the primary antenna A1 and the tertiary antennae A3, and a second compensation circuit 42 is coupled between the secondary antenna A2 and the quaternary antenna A4. As described in detail below, each compensation circuit 42 exhibits a negative capacitance within one or more frequency ranges of interest. The negative capacitance is effectively provided in parallel with the coupling capacitance $C_C$. As such, the negative capacitance of the compensation circuit 42 is in parallel with the coupling capacitance $C_C$, which naturally is a normal (positive) capacitance. Placing the coupling capacitance $C_C$, which has a positive capacitance, in parallel with the compensation circuit 42, which has a negative capacitance, effectively reduces the coupling capacitance $C_C$ by the amount of the negative capacitance provided by the compensation circuit 42 because capacitance in parallel is additive. In essence, each compensation circuit 42 is designed to provide sufficient negative capacitance to partially or completely negate the coupling capacitance $C_C$, at least within one or more frequency ranges of interest. These frequency ranges will generally correspond to transmit or receive bands supported by the mobile terminal 40.

Figure 6:
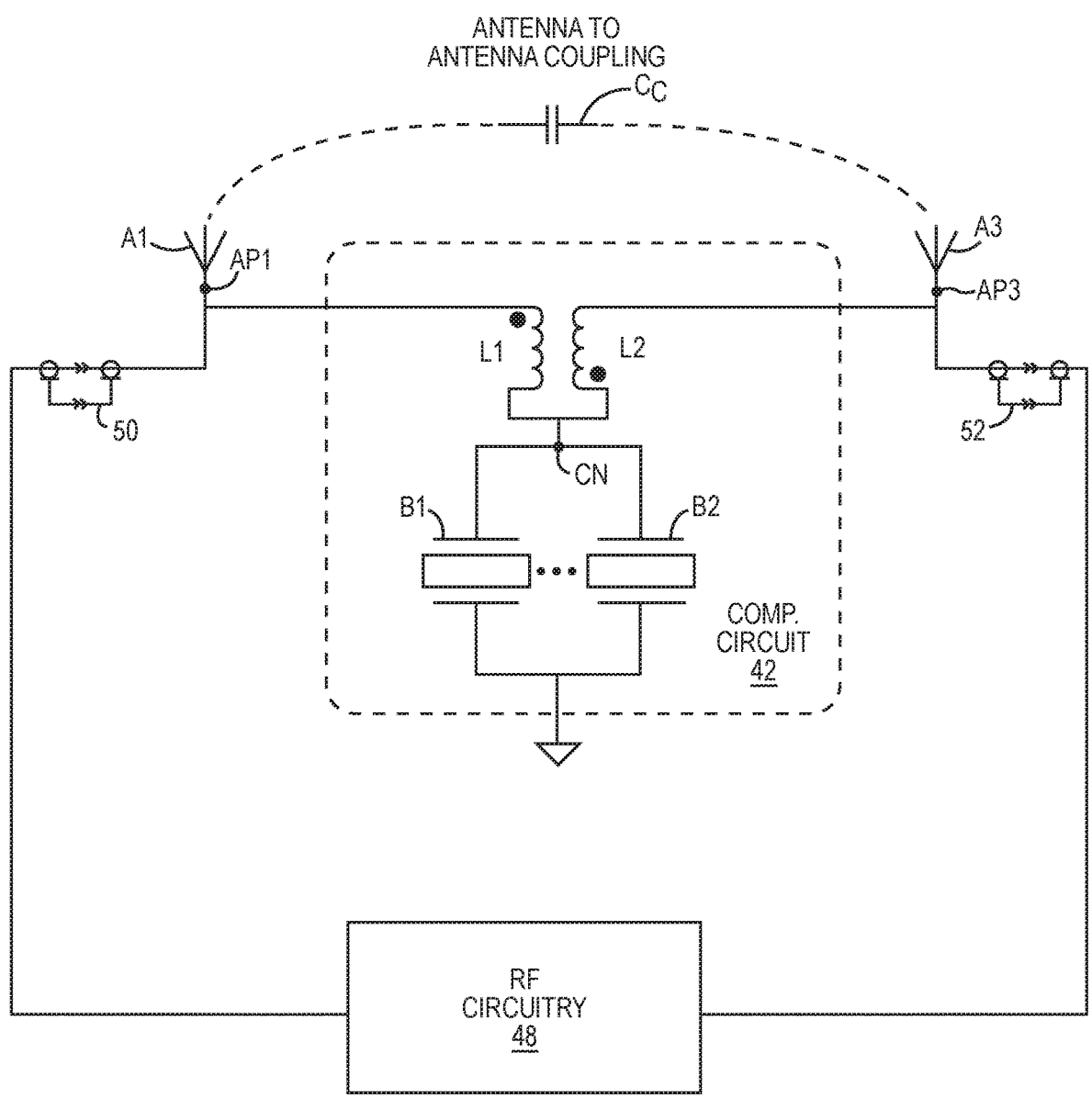
FIG. 6 is a schematic of front end circuitry having a compensation circuit to mitigate antenna-to-antenna coupling according to a first embodiment.

With reference to FIG. 6, an exemplary compensation circuit 42 is shown in association with RF circuitry 48 and the primary and tertiary antennas A1 and A3. As illustrated, the RF circuitry 48 is coupled with antennas A1 and A3 via separate paths. In particular, antenna A1 is coupled to the RF circuitry 48 through coaxial cable 50, and antenna A3 is coupled to the RF circuitry 48 through coaxial cable 52. In general, the RF circuitry 48 may transmit and receive through select bands via antenna A1 as well as transmit and receive through the same or different bands via antenna A3. Given the proximity of antenna A1 to antenna A3, the coupling capacitance $C_C$ effectively exists between antenna A1 and antenna A3. For ease of reference below, assume that antenna A1 is coupled to the circuit at antenna port AP1, and antenna A3 is coupled to the circuit at antenna port AP3, such that the compensation circuit 42 is coupled between the antenna port AP1 and antenna port AP3.

The compensation circuit 42 is coupled in parallel with the coupling capacitance $C_C$ to compensate for some or all of the capacitance presented by the coupling capacitance $C_C$. In the illustrated example, the compensation circuit 42 includes two negatively coupled inductors L1, L2 and two shunt resonators B1 and B2. The inductors L1, L2 are coupled in series between antenna port AP1 and antenna port AP3, wherein a common node CN is provided between the inductors L1, L2. The inductors L1, L2 are magnetically coupled by a coupling factor K, wherein the dots illustrated in association with the inductors L1, L2 indicate that the magnetic coupling is negative. As such, the inductors L1, L2 are connected in electrical series and negatively coupled from a magnetic coupling perspective. As defined herein, two (or more) series-connected inductors that are negatively coupled from a magnetic perspective are inductors that are connected in electrical series; and the mutual inductance between the two inductors functions to decrease the total inductance of the two (or more) inductors.

The shunt resonators B1 and B2 are coupled between the common node CN and ground, or other fixed voltage node.

To compensate for at least some of the capacitance of the coupling capacitance $C_C$, the compensation circuit 42 presents itself as a negative capacitance within certain frequency ranges when coupled between antenna ports AP1 and AP3. Since capacitances in parallel are additive, using the compensation circuit 42 to provide a negative capacitance in parallel with the (positive) capacitance of the coupling capacitance $C_C$ effectively reduces or eliminates the coupling capacitance $C_C$ between antenna A1 and antenna A3 within one or more frequency ranges while having little or no impact on the rest of the circuitry of the mobile terminal 40. The theory of operation for the compensation circuit 42 and various alternative configurations for the compensation circuit 42 are provided further below.

Figure 7:
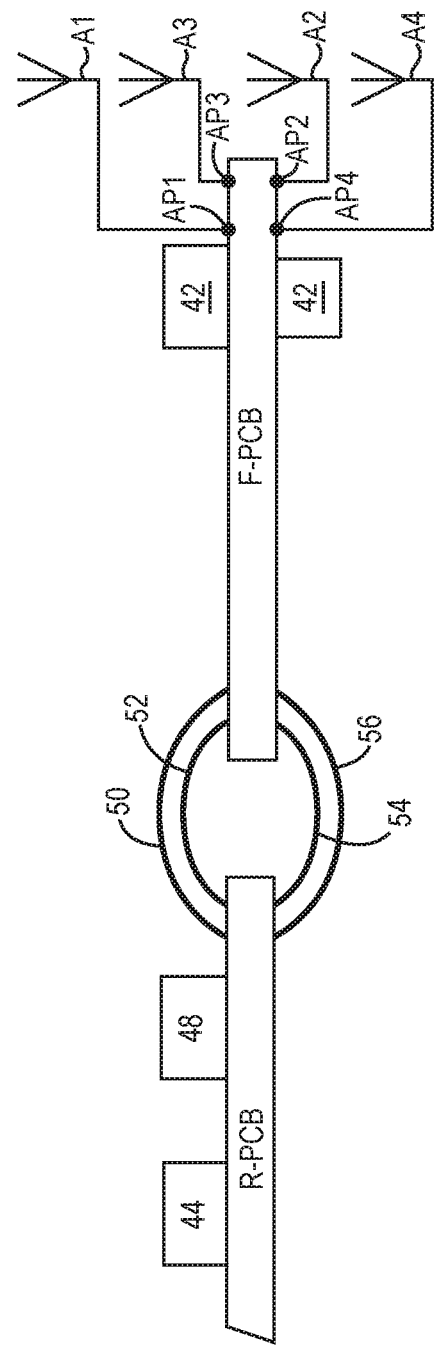
FIG. 7 illustrates a rigid PCB and a flexible PCB coupled together by multiple coaxial cables according to a first embodiment.

With reference to FIG. 7, the mobile terminal 40 may employ multiple printed circuit boards (PCBs) to implement the necessary electronics for operation. Further, the various antennas A1-A4 may be spread about the mobile terminal 40. These antennas A1-A4 may be implemented on or in a housing H (illustrated in FIG. 5) of the mobile terminal 40, on the various PCBs, or combination thereof. FIG. 7 illustrates a rigid PCB (R-PCB) and a flexible PCB (F-PCB), which are used to implement at least part of the electronics for the mobile terminal 40. In one embodiment, the rigid PCB R-PCB may be a traditional glass-reinforced multilayer circuit board, wherein the flexible PCB F-PCB is provided by a much thinner, flexible substrate on which traces and components may be formed or mounted. The flexible PCB F-PCB will have a flex factor of at least ten times that of the rigid PCB R-PCB.

As illustrated, the control circuitry 44 and the RF circuitry 48 are implemented in whole or in part on the rigid PCB R-PCB while compensation circuits 42 and any antenna tuning circuitry (not shown) are implemented on the flexible PCB F-PCB. The coaxial cables 50, 52, 54, 56 connect the rigid PCB R-PCB and the flexible PCB F-PCB such that the transmit/receive paths that extend between the RF circuitry 48 and the respective antennas A1, A2, A3, and A4 are provided by the combination of the rigid PCB R-PCB, the flexible PCB F-PCB, and the coaxial cables 50, 52, 54, 56. These transmit/receive paths extend to corresponding antenna ports AP1, AP2, AP3, AP4 of the flexible PCB F-PCB. The antennas A1, A2, A3, and A4 are connected to the antenna ports AP1, AP2, AP3, AP4, respectively, through additional cables, traces, and/or the like. As defined herein, a transmit/receive path is at least a portion of a signal path that extends between the RF circuitry 48 and an antenna port and is solely used for transmitting a signal, solely used for receiving a signal, or a combination of transmitting and receiving signals.

Figure 8:
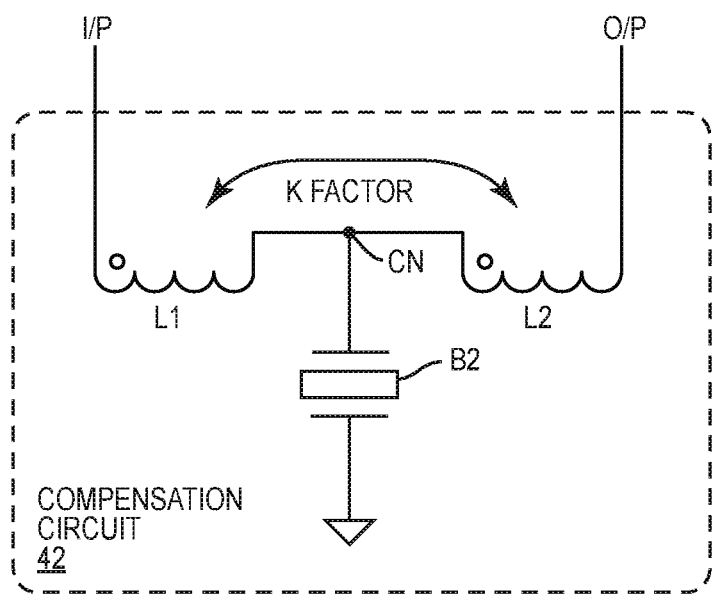
FIG. 8 illustrates a compensation circuit according to a second embodiment.

Turning now to FIG. 8, an alternative compensation circuit 42 includes two negatively coupled inductors L1, L2 and a shunt resonator B2. The inductors L1, L2 are coupled in series between the input node VP and the output node O/P, wherein a common node CN is provided between the inductors L1, L2. A single shunt resonator B2 is coupled between the common node CN and ground, or other fixed voltage node.

Figure 9:
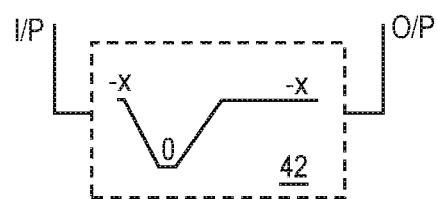
FIG. 9 is a graph that illustrates exemplary frequency responses for the compensation circuit of FIG. 8.

To compensate for at least some of the capacitance of the series resonator B1, the compensation circuit 42 presents itself as a negative capacitance within certain, limited frequency ranges when coupled between a pair of coupled antennas. FIG. 9 graphically illustrates the frequency response of the compensation circuit 42. Further detail on this particular circuit topology can be found in the co-assigned U.S. patent application Ser. No. 15/004,084, filed Jan. 22, 2016, and subsequently patented as U.S. Pat. No. 9,837,984 on Dec. 5, 2017, and titled RF LADDER FILTER WITH SIMPLIFIED ACOUSTIC RF RESONATOR PARALLEL CAPACITANCE COMPENSATION, and U.S. patent application Ser. No. 14/757,651, filed Dec. 23, 2015, published as U.S. Patent Application Publication No. 2016/0191014 on Jun. 30, 2016, and titled SIMPLIFIED ACOUSTIC RF RESONATOR PARALLEL CAPACITANCE COMPENSATION, the disclosures of which are incorporated herein by reference in their entireties.

Figure 10:
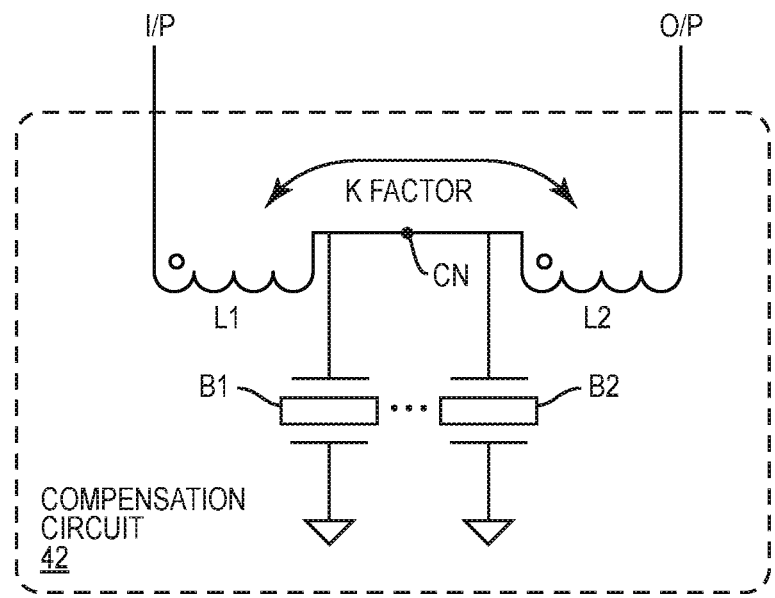
FIG. 10 illustrates a compensation circuit according to a second embodiment.
Figure 11:
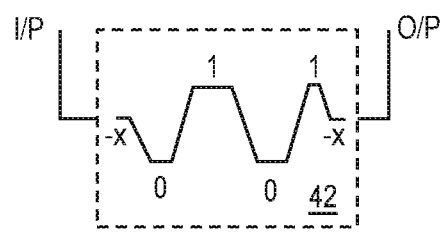
FIG. 11 is a graph that illustrates exemplary frequency responses for the compensation circuit of FIG. 10.

While beneficial in certain applications, the compensation circuit 42 of FIG. 8 has its limitations. With reference to FIG. 10, a modified compensation circuit 42 is illustrated wherein the compensation circuit 42 of FIG. 8 is modified to include an additional shunt resonator B1, which is coupled between the common node CN and ground. As such, a new compensation circuit 42 is created that includes the negatively coupled inductors L1 and L2, which have a coupling coefficient K, and at least two shunt resonators B1, B2. When the series resonance frequencies $F_s$ of the shunt resonators B1, B2 are different from one another, negative capacitance behavior is presented in multiple frequency ranges, as will be illustrated further below. FIG. 11 graphically illustrates the frequency response of the compensation circuit 42 of FIG. 10. The series resonance frequencies $F_s$ of the shunt resonators B1, B2 are generally different from one another. While only two shunt resonators B1, B2 are illustrated, any number of these resonators may be employed depending on the application.

Figure 12A:
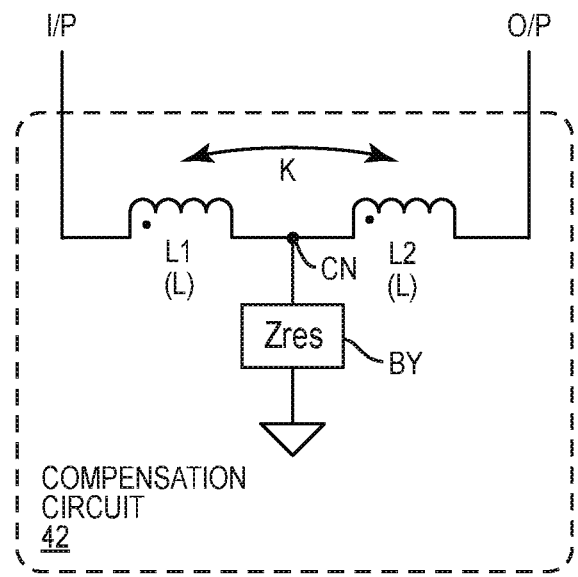
FIGS. 12A through 12D illustrate transformation of the T-circuit impedance architecture of the compensation circuit of FIG. 10 to a π (pi) impedance model.

The theory of the compensation circuit 42 follows and is described in association with FIGS. 12A through 12D. With reference to FIG. 12A, assume the compensation circuit 42 includes the two negatively coupled inductors L1, L2, which have an inductance value L, and two or more shunt resonators BY, which have an overall shunt impedance Zres presented between the common node CN and ground. While the inductance values L of the negatively coupled inductors L1, L2 are described as being the same, these values may differ depending on the application.

Figure 12B:
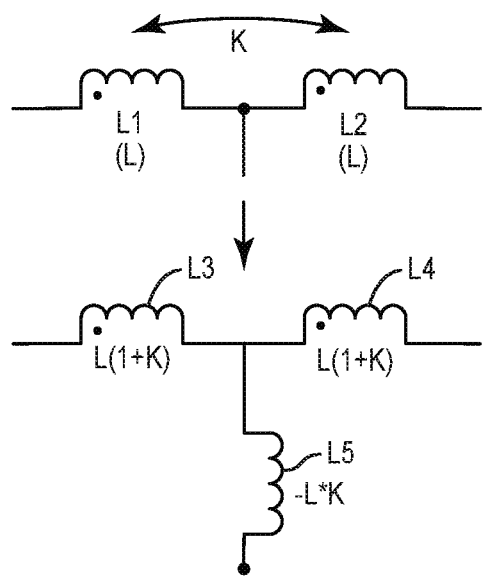
Figure 12C:
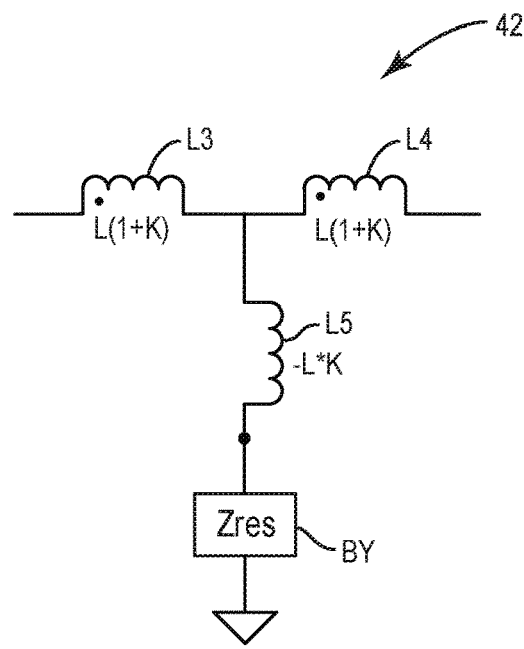

As shown in FIG. 12B, the two negatively coupled and series-connected inductors L1, L2 (without Zres) can be modeled as a T-network of three inductors L3, L4, and L5, wherein series inductors L3 and L4 are connected in series and have a value of L(1+K), and shunt inductor L5 has a value of −L*K, where K is a coupling factor between the negatively coupled inductors L1, L2. Notably, the coupling factor K is a positive number between 0 and 1. Based on this model, the overall impedance of the compensation circuit 42 is modeled as illustrated in FIG. 12C, wherein the shunt impedance Zres is coupled between the shunt inductor L5 and ground. The resulting T-network, as illustrated in FIG. 12C, can be transformed into an equivalent π (pi) network, as illustrated in FIG. 12D.

Figure 12D:
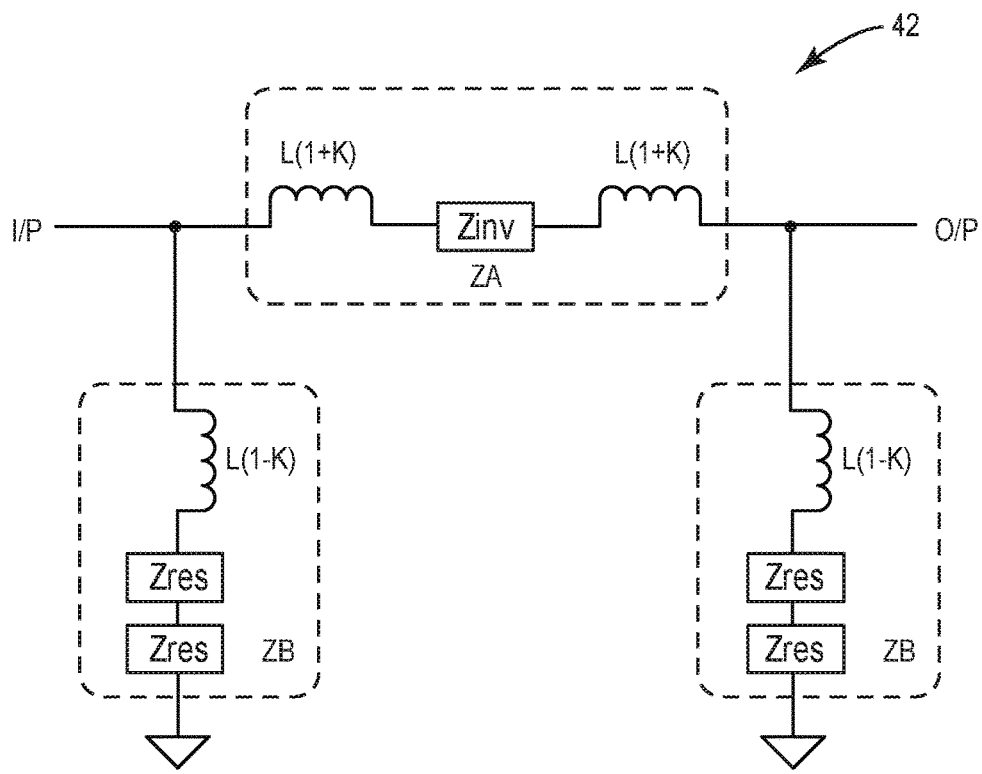

The π network of FIG. 12D can be broken into a series impedance ZA and two shunt equivalent impedances ZB. The series equivalent impedance ZA is represented by two series inductances of value L*(1+K), where K>0, and a special "inversion" impedance Zinv. The inversion impedance Zinv is equal to $[L(1+K)\omega]^2/[Zres-jLK\omega]$, where $\omega=2\pi f$ and f is the frequency. As such, the series equivalent impedance ZA equals $j*2*L(1+K)\omega+Zinv$ and is coupled between the input node I/O and the output node O/P. Each of the two shunt equivalent impedances ZB is represented by an inductor of value L(1−K) in series with two overall shunt impedances Zres.

Figure 13:
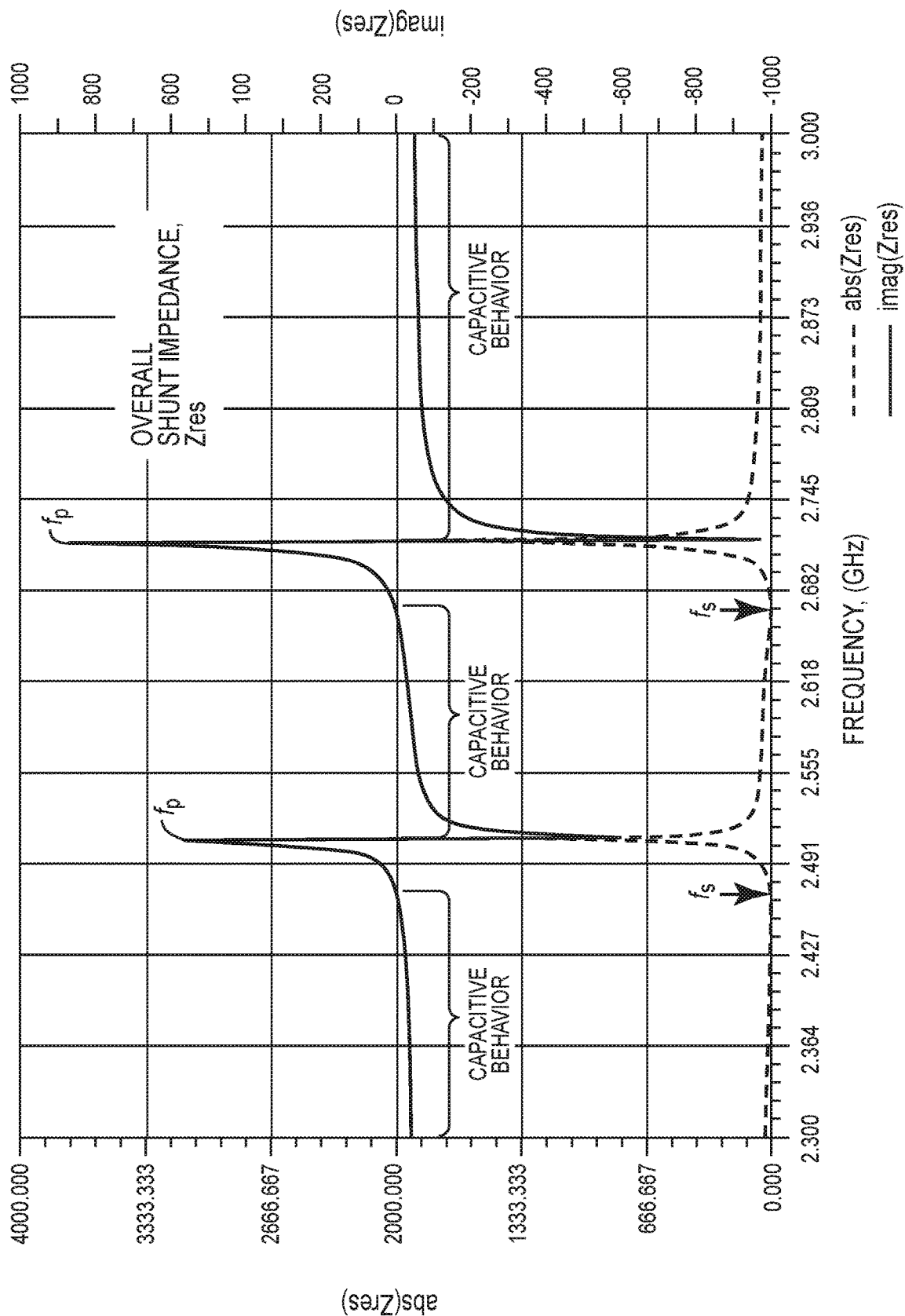
FIG. 13 is a graph illustrating the overall shunt impedance, Zres, according to one embodiment.

Notably, the series equivalent impedance ZA has a negative capacitor behavior at certain frequencies and has series resonance at multiple frequencies. In general, the series equivalent impedance ZA has a multiple bandpass-bandstop characteristic, in that the series equivalent impedance ZA will pass some frequencies and stop others. The series equivalent impedance ZA has two notable characteristics. The first provides a negative capacitive behavior, and the second provides one or more additional series resonances between the input node I/P and the output node O/P. These additional series resonances are provided through the series equivalent impedance ZA. To help explain the benefits and concept of the negative capacitive behavior provided by the series equivalent impedance ZA, normal capacitive behavior is illustrated in association with the overall shunt impedance Zres, which is provided by the shunt resonators BY. FIG. 13 graphs the absolute (magnitude) and imaginary components of the overall shunt impedance Zres, which is formed by two shunt resonators BY, which are coupled in parallel with one another.

The series resonance frequency $F_s$ for each of the two shunt resonators BY (i.e. B1, B2) occurs when the absolute impedance (abs(Zres)) is at or near zero. Since there are two shunt resonators BY, the absolute impedance (abs(Zres)) is at or near zero at two frequencies, and as such, there are two series resonance frequencies $F_s$. The parallel resonance frequencies $F_p$ occur when the imaginary component (imag (Zres)) peaks. Again, since there are two shunt resonators BY, there are two series resonance frequencies $F_s$ provided by the overall shunt impedance Zres.

Whenever the imaginary component (imag(Zres)) of the overall shunt impedance Zres is less than zero, the overall shunt impedance Zres has a capacitive behavior. The capacitive behavior is characterized in that the reactance of the overall shunt impedance Zres is negative and decreases as frequency increases, which is consistent with capacitive reactance, which is represented by 1/jωC. The graph of FIG. 13 identifies three regions within the impedance response of the overall shunt impedance Zres that exhibit capacitive behavior.

Figure 14:
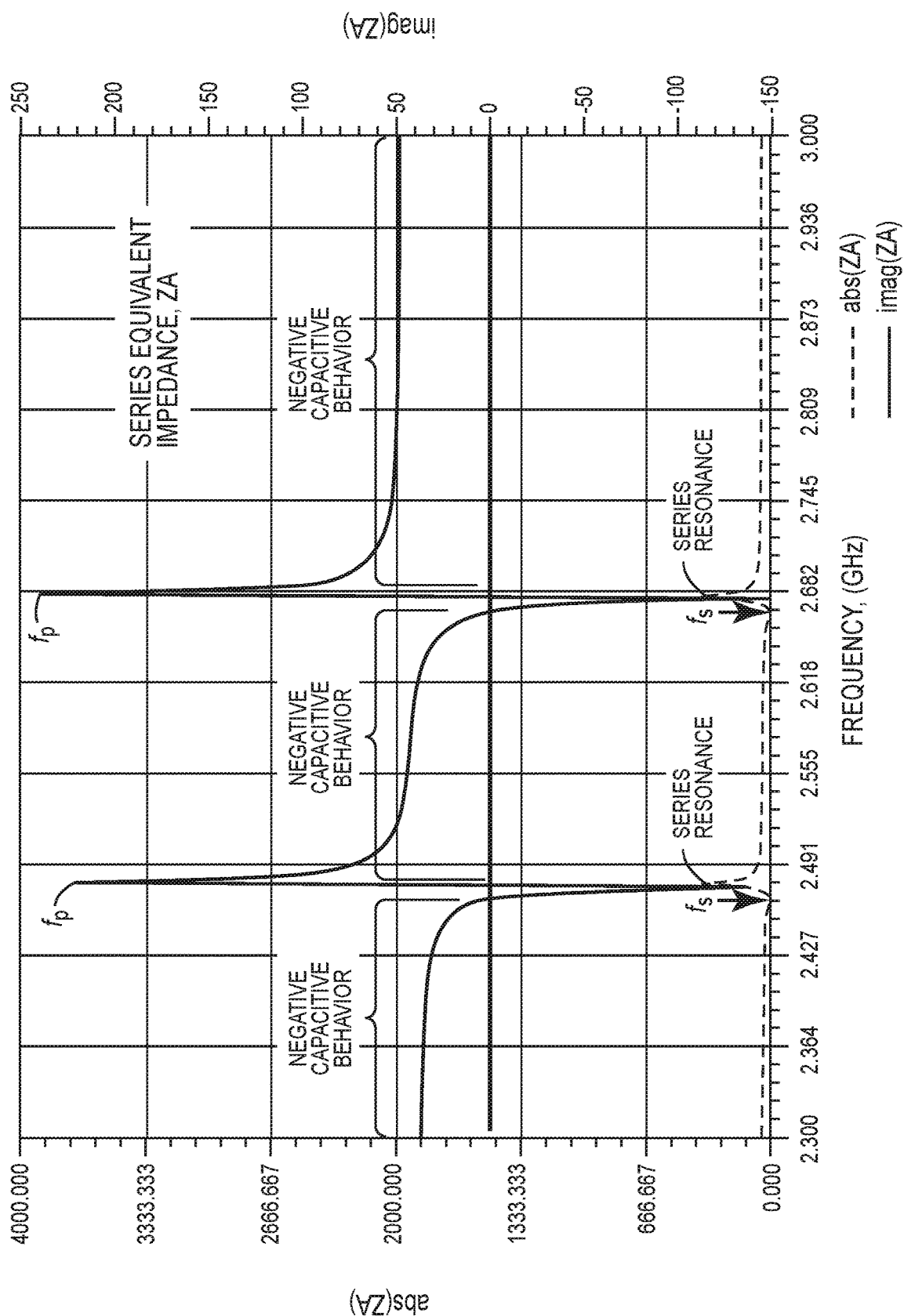
FIG. 14 is a graph illustrating the series equivalent impedance, ZA, according to one embodiment.

Turning now to FIG. 14, the series equivalent impedance ZA is illustrated over the same frequency range as that of the overall shunt impedance Zres, which was illustrated in FIG. 13. The series equivalent impedance ZA has two series resonance frequencies $F_s$, which occur when the absolute impedance (abs(ZA)) is at or near zero. The two series resonance frequencies $F_s$ for the series equivalent impedance ZA are different from each other and slightly different from those for the overall shunt impedance Zres. Further, the number of series resonance frequencies $F_s$ generally corresponds to the number of shunt resonators BY in the compensation circuit 42, assuming the series resonance frequencies $F_s$ are different from one another.

Interestingly, the imaginary component (imag(ZA)) of the series equivalent impedance ZA is somewhat inverted with respect to that of the overall shunt impedance Zres. Further, the imaginary component (imag(ZA)) of the series equivalent impedance ZA has a predominantly positive reactance. During the portions at which the imaginary component (imag(ZA)) is positive, the reactance of the series equivalent impedance ZA again decreases as frequency increases, which is indicative of capacitive behavior. However, the reactance is positive, whereas traditional capacitive behavior would present a negative reactance. This phenomenon is referred to as negative capacitive behavior. Those portions of the imaginary component (imag(ZA)) of the series equivalent impedance ZA that are positive and thus exhibit negative capacitive behavior are highlighted in the graph of FIG. 14.

The negative capacitive behavior of the series equivalent impedance ZA for the compensation circuit 42 is important, because when the series equivalent impedance ZA is placed in parallel with the coupling capacitance $C_C$, the effective capacitance between the associated pair of antennas is reduced or eliminated in the desired frequency ranges.

Figure 15:
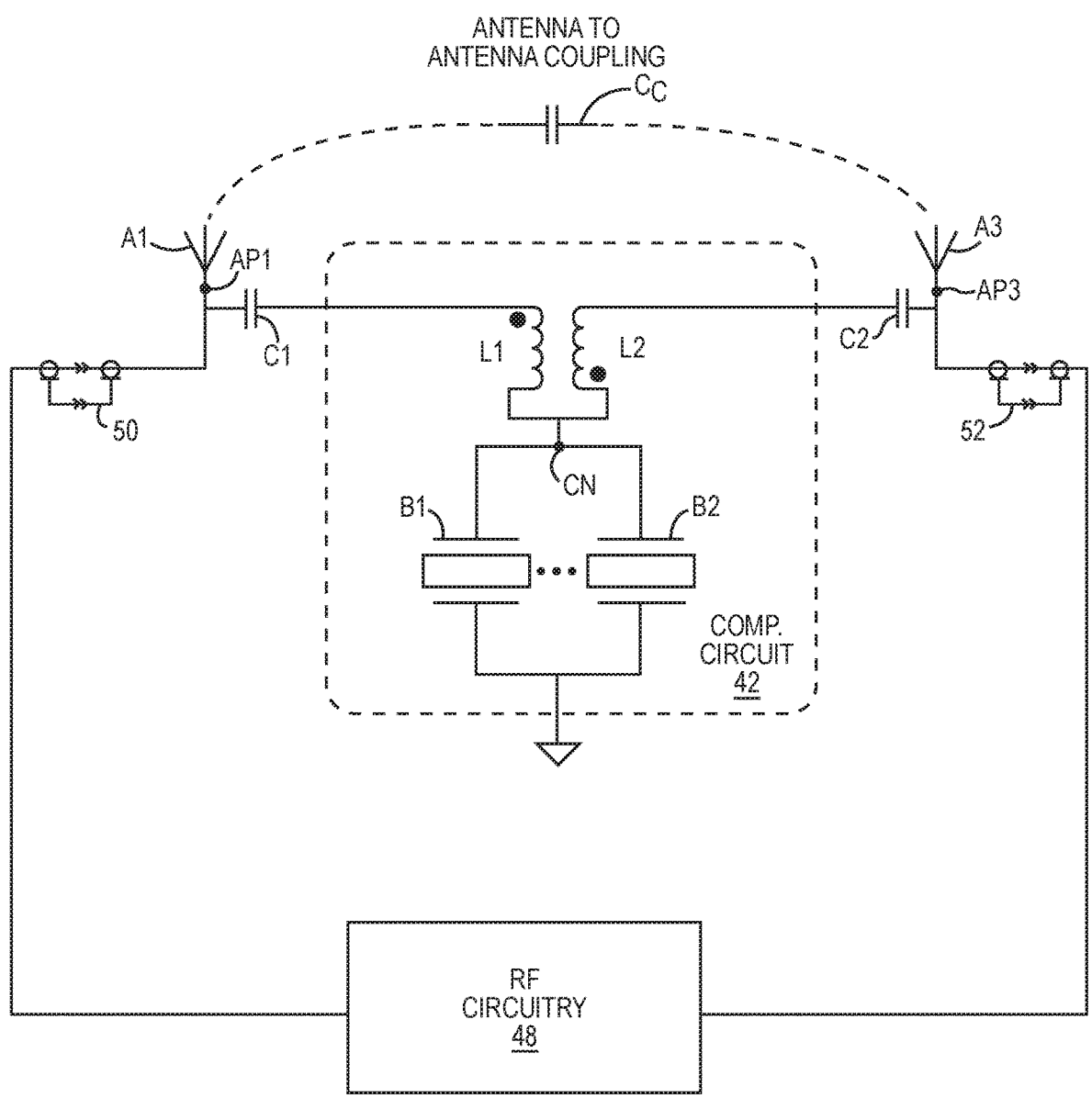
FIG. 15 is a schematic of front end circuitry having a compensation circuit to mitigate antenna-to-antenna coupling according to a third embodiment.

Turning now to FIG. 15, another embodiment is provided wherein capacitors are used to couple the compensation circuit 42 to the various antennas A1-A4 (or antenna ports AP1-AP4). For example, capacitor C1 is coupled between antenna port AP1 and a first port of the compensation circuit 42, and capacitor C2 is coupled between antenna port AP2 and a second port of the compensation circuit 42 such that the capacitor C1, the compensation circuit 42, and capacitor C2 are provided in series between antennas A1 and antenna A3 and in parallel with the coupling capacitance $C_C$.

Figure 16:
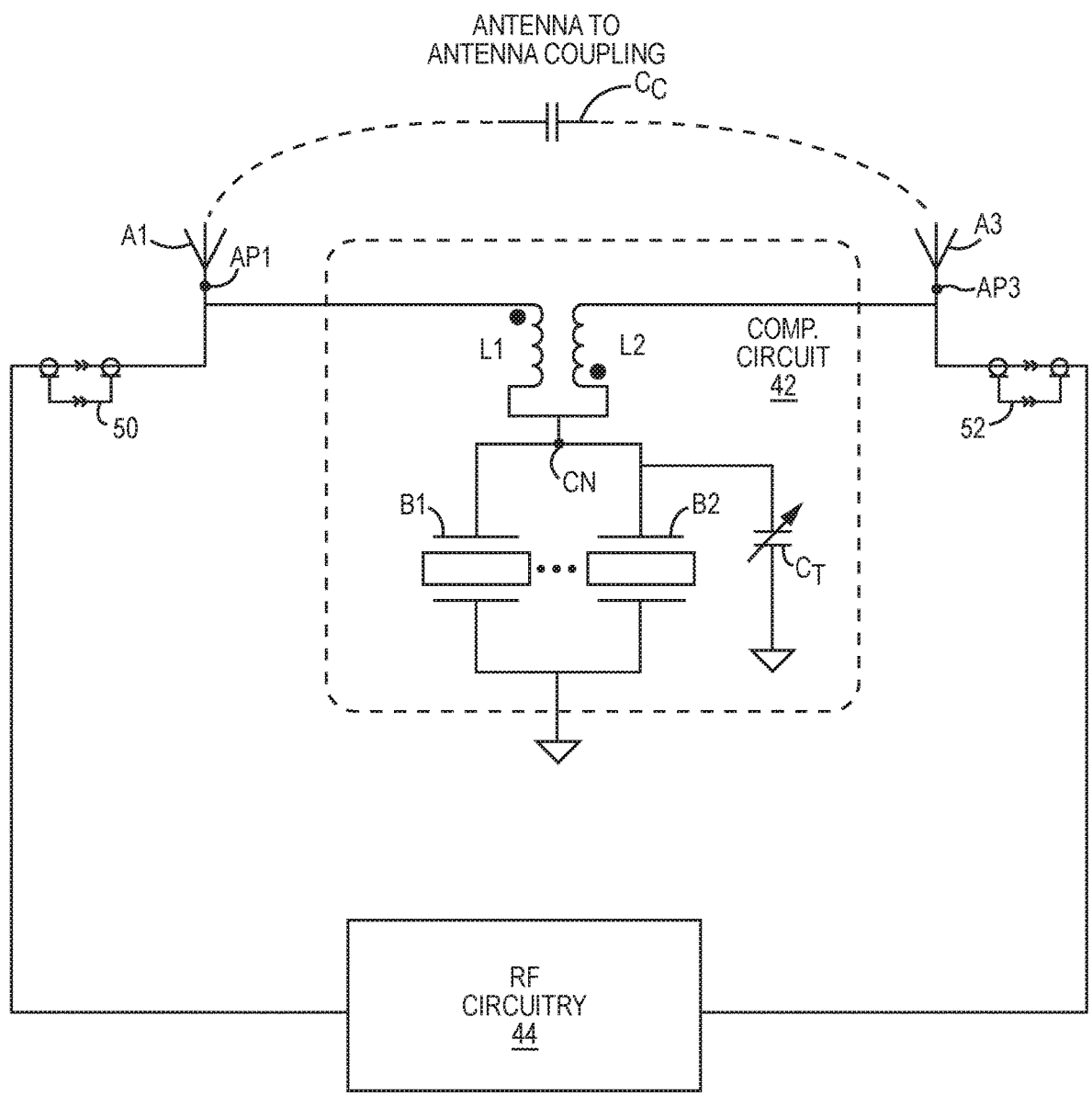
FIG. 16 is a schematic of front end circuitry having a compensation circuit to mitigate antenna-to-antenna coupling according to a fourth embodiment.

FIG. 16 illustrates an embodiment similar to that of FIG. 6 with the exception of providing a tunable capacitance $C_T$ in parallel with the shunt resonators B1, B2. The tunable capacitance $C_T$ may take the form of a varactor or bank of switched capacitors, wherein the tunable capacitance $C_T$ may be varied based on an operating mode, transmit/receive bands, environmental conditions, and the like. The tunable capacitance $C_T$ may be tuned by the RF circuitry 48, the control circuitry 44, or the like. Changing the capacitance of the tunable capacitance $C_T$ will affect the location and magnitude of the negative capacitance provided by the compensation circuit 42.

Figure 17:
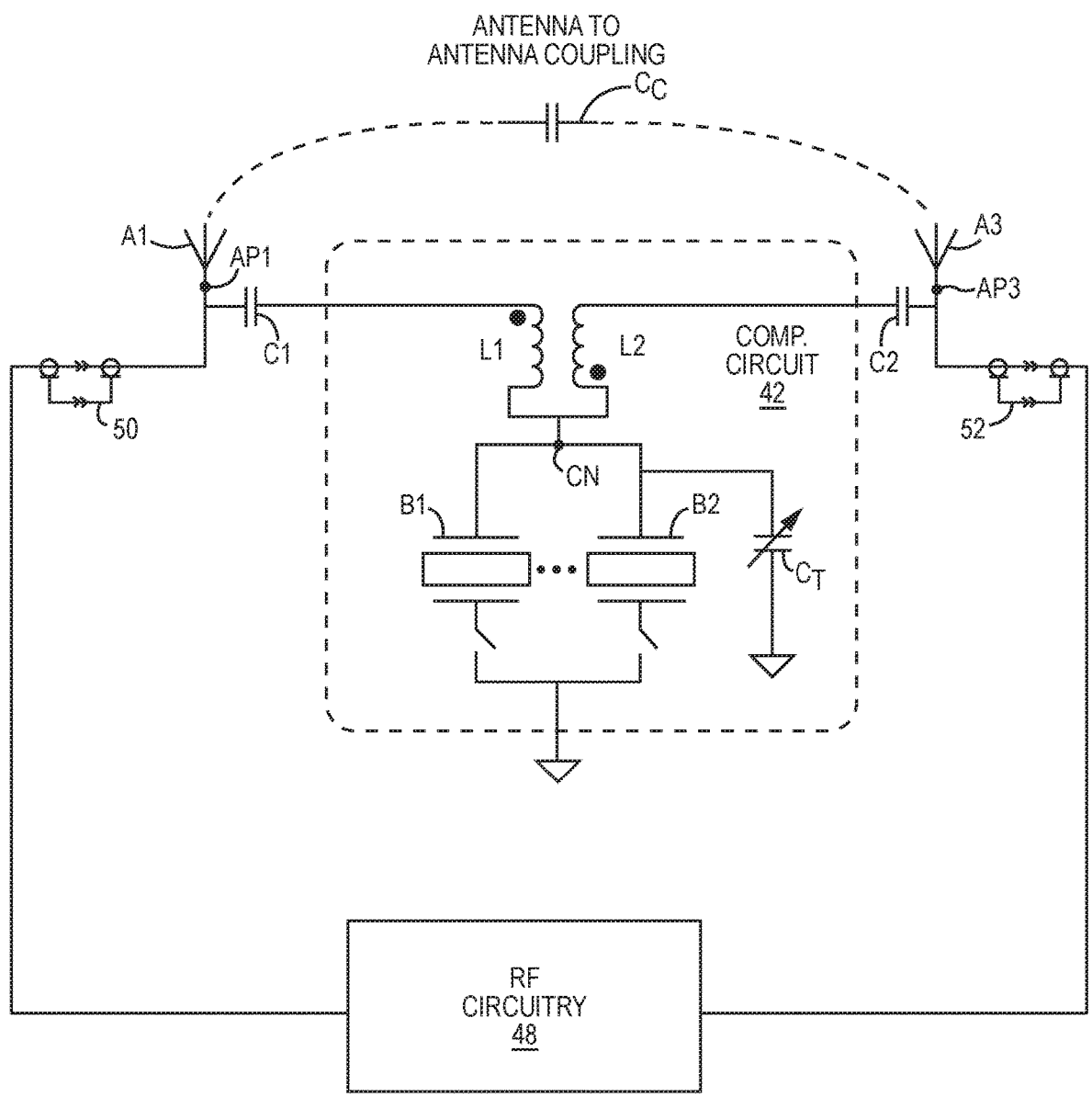
FIG. 17 is a schematic of front end circuitry having a compensation circuit to mitigate antenna-to-antenna coupling according to a fifth embodiment.

The embodiments of FIGS. 15 and 16 may be combined as illustrated in FIG. 17. In essence, the capacitors C1 and C2 are employed to couple the compensation circuit 42 to the respective antennas A1 and A3, and the tunable capacitance $C_T$ is provided in parallel with the shunt resonators B1, B2.

While the concepts disclosed herein were described in association with a mobile terminal, these concepts are applicable to any type of communication device that employs wireless communications. Those skilled in the art will recognize numerous modifications and other embodiments that incorporate the concepts described herein. These modifications and embodiments are considered to be within scope of the teachings provided herein and the claims that follow.

What is claimed is:
1. Circuitry comprising:
   a first antenna port and a second antenna port;
   a first transmit/receive path extending to the first antenna port;

a second transmit/receive path extending to the second antenna port; and
a compensation circuit comprising:
  a first inductor and a second inductor coupled in series between the first antenna port and the second antenna port, wherein the first inductor and the second inductor are negatively coupled with one another and a common node is provided between the first inductor and the second inductor; and
  at least one shunt acoustic resonator coupled between the common node and a fixed voltage node, wherein the compensation circuit presents a negative capacitance between the first antenna port and the second antenna port over a first frequency range corresponding to at least one series resonance frequency of the at least one shunt acoustic resonator.

2. The circuitry of claim 1 wherein the at least one shunt acoustic resonator comprises:
  a first shunt acoustic resonator coupled between the common node and the fixed voltage node; and
  a second shunt acoustic resonator coupled between the common node and the fixed voltage node.

3. The circuitry of claim 2 wherein the first shunt acoustic resonator has a first series resonance frequency and the second shunt acoustic resonator has a second series resonance frequency that is different from the first series resonance frequency.

4. The circuitry of claim 3 wherein the first inductor and the second inductor have different inductances.

5. The circuitry of claim 4 wherein the compensation circuit further presents a second negative capacitance over a second frequency range that is different than the first frequency range.

6. The circuitry of claim 5 further comprising radio frequency circuitry, a first antenna, and a second antenna, wherein the first transmit/receive path extends between the radio frequency circuitry and the first antenna through the first antenna port, and the second transmit/receive path extends between the radio frequency circuitry and the second antenna through the second antenna port.

7. The circuitry of claim 2 further comprising:
  a first capacitor coupled between the first antenna port and the first inductor; and
  a second capacitor coupled between the second antenna port and the second inductor, such that the first capacitor, the first inductor, the second inductor, and the second capacitor are coupled in series between the first antenna port and the second antenna port.

8. The circuitry of claim 2 further comprising a variable capacitance coupled between the common node and the fixed voltage node.

9. The circuitry of claim 2 further comprising:
  a first capacitor coupled between the first antenna port and the first inductor;
  a second capacitor coupled between the second antenna port and the second inductor such that the first capacitor, the first inductor, the second inductor, and the second capacitor are coupled in series between the first antenna port and the second antenna port; and
  a variable capacitance coupled between the common node and the fixed voltage node.

10. The circuitry of claim 1 wherein the compensation circuit further presents a second negative capacitance over a second frequency range that is different than the first frequency range.

11. The circuitry of claim 10 wherein the first inductor and the second inductor have different inductances.

12. The circuitry of claim 1 further comprising radio frequency circuitry, a first antenna, and a second antenna, wherein the first transmit/receive path extends between the radio frequency circuitry and the first antenna through the first antenna port, and the second transmit/receive path extends between the radio frequency circuitry and the second antenna through the second antenna port.

13. The circuitry of claim 12 further comprising a first coaxial cable that forms part of the first transmit/receive path and a second coaxial cable that forms part of the second transmit/receive path.

14. The circuitry of claim 13 further comprising a rigid printed circuit board on which the radio frequency circuitry is provided and a flexible printed circuit board on which the compensation circuit is provided, wherein the first coaxial cable and the second coaxial cable are connected between the rigid printed circuit board and the flexible printed circuit board.

15. The circuitry of claim 1 wherein the at least one shunt acoustic resonator is at least one of a bulk acoustic wave (BAW) resonator and a surface acoustic wave (SAW) resonator.

16. Circuitry comprising:
  radio frequency circuitry;
  a first antenna;
  a second antenna;
  a first transmit/receive path extending from the radio frequency circuitry to a first antenna port;
  a second transmit/receive path extending from the radio frequency circuitry to a second antenna port; and
  a compensation circuit comprising:
    a first inductor and a second inductor coupled in series between the first antenna and the second antenna, wherein the first inductor and the second inductor are negatively coupled with one another and a common node is provided between the first inductor and the second inductor; and
    at least one shunt acoustic resonator coupled between the common node and a fixed voltage node, wherein the compensation circuit presents a first negative capacitance between the first antenna and the second antenna over a first frequency range corresponding to at least one series resonance frequency of the at least one shunt acoustic resonator to reduce an effective capacitance presented between the first antenna and the second antenna due to antenna-to-antenna coupling between the first antenna and the second antenna.

17. The circuitry of claim 16 wherein the at least one shunt acoustic resonator comprises:
  a first shunt acoustic resonator coupled between the common node and the fixed voltage node; and
  a second shunt acoustic resonator coupled between the common node and the fixed voltage node.

18. The circuitry of claim 17 wherein:
  the first shunt acoustic resonator has a first series resonance frequency and the second shunt acoustic resonator has a second series resonance frequency that is different from the first series resonance frequency; and
  the first inductor and the second inductor have different inductances.

19. The circuitry of claim 18 wherein the compensation circuit further exhibits negative capacitive behavior over a second frequency range that is different than the first frequency range.

20. The circuitry of claim 16 wherein the compensation circuit further exhibits negative capacitive behavior over a second frequency range that is different than the first frequency range.

* * * * *